United States Patent
Quon et al.

(10) Patent No.: US 7,216,067 B2
(45) Date of Patent: May 8, 2007

(54) NON-LINEAR TEST LOAD AND METHOD OF CALIBRATING A PLASMA SYSTEM

(75) Inventors: Bill H. Quon, Brea, CA (US); Richard Parsons, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 505 days.

(21) Appl. No.: 10/747,087

(22) Filed: Dec. 30, 2003

(65) Prior Publication Data

US 2004/0210407 A1   Oct. 21, 2004

Related U.S. Application Data

(60) Provisional application No. 60/436,958, filed on Dec. 31, 2002.

(51) Int. Cl.
  *G06G 7/48*   (2006.01)
  *G06F 17/10*   (2006.01)

(52) U.S. Cl. .................... 703/4; 703/2; 703/1; 702/57; 315/182

(58) Field of Classification Search ............ 703/2, 703/6, 13, 14, 1, 4; 702/57, 66; 315/111.31, 315/111.21, 182; 324/713; 156/345.28, 156/345.43; 428/698
See application file for complete search history.

(56) References Cited

U.S. PATENT DOCUMENTS

| | | | |
|---|---|---|---|
| 4,762,756 A * | 8/1988 | Bergmann et al. | 428/698 |
| 6,885,153 B2 * | 4/2005 | Quon | 315/111.31 |
| 7,019,543 B2 * | 3/2006 | Quon | 324/713 |
| 2003/0137251 A1 * | 7/2003 | Mitrovic et al. | 315/111.21 |
| 2004/0112536 A1 * | 6/2004 | Quon | 156/345.28 |
| 2004/0168770 A1 * | 9/2004 | Mitrovic et al. | 156/345.43 |

OTHER PUBLICATIONS

Fauchais et al., P. Thermal Plasmas, IEEE Transactions on Plasma Science, vol. 25, No. 6, Dec. 1997, pp. 1258-1280.*
Paik et al., S. Numerical Modeling of Multiphase Plasma/Soil Flow and Heat Transfer in an Electric Arc Furnace, International Journal of Heat and Mass Transfer, vol. 38, No. 7, May 1995, pp. 1161-1171.*

(Continued)

*Primary Examiner*—Russell Frejd
(74) *Attorney, Agent, or Firm*—Oblon, Spivak, McClelland, Maier & Neustadt, P.C.

(57) ABSTRACT

A non-linear test load is provided for calibrating a plasma system. The test load is a substrate for modeling the electrical characteristics of the plasma such that multi frequency testing can be performed in the absence of a plasma reaction. An exemplary substrate includes a first semiconductor junction for providing a non-linear response to the multi-frequency RF source provided from the anode. The first semiconductor junction exhibits a first capacitance for modeling a first plasma sheath of the anode. A plasma component is responsive to the first semiconductor junction and exhibits a resistance for modeling a resistance of the plasma, an inductance for modeling an inductance of the plasma, and a gap capacitance for modeling capacitance of the plasma. A second semiconductor junction is responsive to the plasma component for providing a non-linear response to the multi-frequency RF source provided from the plasma component, the second semiconductor junction exhibits a second capacitance for modeling a second plasma sheath of the cathode.

13 Claims, 10 Drawing Sheets

OTHER PUBLICATIONS

Ezumi et al., N. Contribution of Molecular Activated Recombination to Hydrogen Plasma Detachment in the Divertor Plasma Simulator NAGDIS-II, Jpurnal of Nuclear Materials, vols. 266-269, Mar. 1999, pp. 337-342.*

Rott et al., M. New Monopulse Plasma Generation and Acceleration Facility for Surface Treatment, IEEE Transactions on Magnetics, vol. 37, No. 1, Jan. 2001, pp. 232-7.*

* cited by examiner

CIRCUIT ELEMENTS

NON-LINEAR TEST LOAD AND METHOD OF CALIBRATING A PLASMA SYSTEM

CROSS-REFERENCE TO RELATED APPLICATIONS

This application claims priority to and is related to U.S. Provisional Application Ser. No. 60/436,958, filed on Dec. 31, 2002. The contents of this application are incorporated herein by reference.

BACKGROUND OF THE INVENTION

1. Field of the Invention

The present invention relates, generally, to a system and method of calibrating a plasma device. More particularly, the present invention provides a non-linear test load for calibrating a multiple frequency plasma device in the absence of a plasma reaction to facilitate testing of the system under operating conditions.

2. Discussion of the Background

Plasma devices or "reactors" are widely utilized for deposition processing, as well as dry etching processing such as "ashing" and "sputtering" utilized in the manufacture of semiconductor devices. In use, the plasma device introduces "plasma" or ionized gas to serve as a conduction medium which is interposed between opposing electrodes (i.e., anode and cathode). A high voltage discharge is placed across the electrodes such that the conduction of electrons across the plasma gap between the anode and cathode causes a self sustained scattering of collisions with plasma molecules (collisional ionization) or "plasma reaction", creating a cascading of charged particles at the surface of an opposite electrode. By positioning a semiconductor substrate at the opposing electrode, chemical reaction of the substrate with the bombarding particles (depending on chemistry of plasma and substrate) enables a selective deposition and/or etching process. In etching processes, this enables certain materials to be removed at a faster rate relative to others in accordance with known chemical reactions. The removed materials are often pumped away in the form of gas phase molecules.

While the discharge voltage can be driven by either an AC or DC source, AC is preferred over DC as AC signals are not as limited by capacitive charging transients and are especially efficient at higher frequencies such as in the radio frequency (RF) spectrum. In determining the necessary discharge and associated multi-frequency operational parameters for sustaining the plasma reaction, the spatial distribution of charges within a plasma must be considered across multiple frequencies.

Importantly, the two main spatial areas are (1) the "sheath" areas and (2) the gap areas. The sheath areas occur in the vicinity of each electrode (or other surface) contacting the plasma. These "sheath" areas are also sometimes referred to as "dark spaces." The sheath areas are created by a regional accumulation of electrons and/or ions. (Most of the voltage applied to the plasma is dropped across the sheath regions.) The gap area is generally any region bounded by sheath areas that has a lower concentration of electrons and/or ions.

Probe circuitry may be utilized in conjunction with the plasma device to assess operational performance. Typically, a dummy load is placed in the device, and data is provided for a single frequency. Typically the single frequency is the fundamental frequency of the process. Yet, this data is of limited use as it is only directed to a single frequency, requires the presence of plasma, and is cost prohibitive to repeat for varying frequency values.

SUMMARY OF THE INVENTION

Accordingly, a non-linear plasma test load (plasma model) is desirable if it provides system data absent a plasma reaction to facilitate testing of the system under multi-frequency operating conditions.

A non-linear test load is provided for calibrating a multi-frequency plasma device in the presence or absence of plasma to facilitate testing of the system under multi-frequency operating conditions. The non-linear test load employs circuitry having electrical properties which model the those of an operating plasma system across multiple frequencies, but by using the circuitry, no plasma is actually required in the system. In this way, the electrical response of the provided non-linear test load is substantially similar to the response of the plasma and provides repeatable characteristic data (i.e., a fingerprint) for the system under a slected set of operating conditions. Further, the test load of the present invention provides the ability to easily apply various operating levels of harmonic voltages and currents for testing and calibrating a sensor or probe device. A database may be assembled from the multi-frequency data for modeling of the operational characteristics of the plasma system.

In accordance with one aspect of the present invention, a non-linear test load is provided for use between the anode and cathode plates of a capacitively-coupled plasma processing system. The test load is a device that models the electrical characteristics of a plasma normally produced between the anode and cathode plates such that multi-frequency testing can be performed in the absence of a plasma reaction. In one embodiment, the device includes (1) first and second semiconductor junctions which help to simulate the non-linear responses of the plasma near the anode and cathode plates, respectively, and (2) electrical components which simulate the gap area.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE INVENTION

Figure 1A:
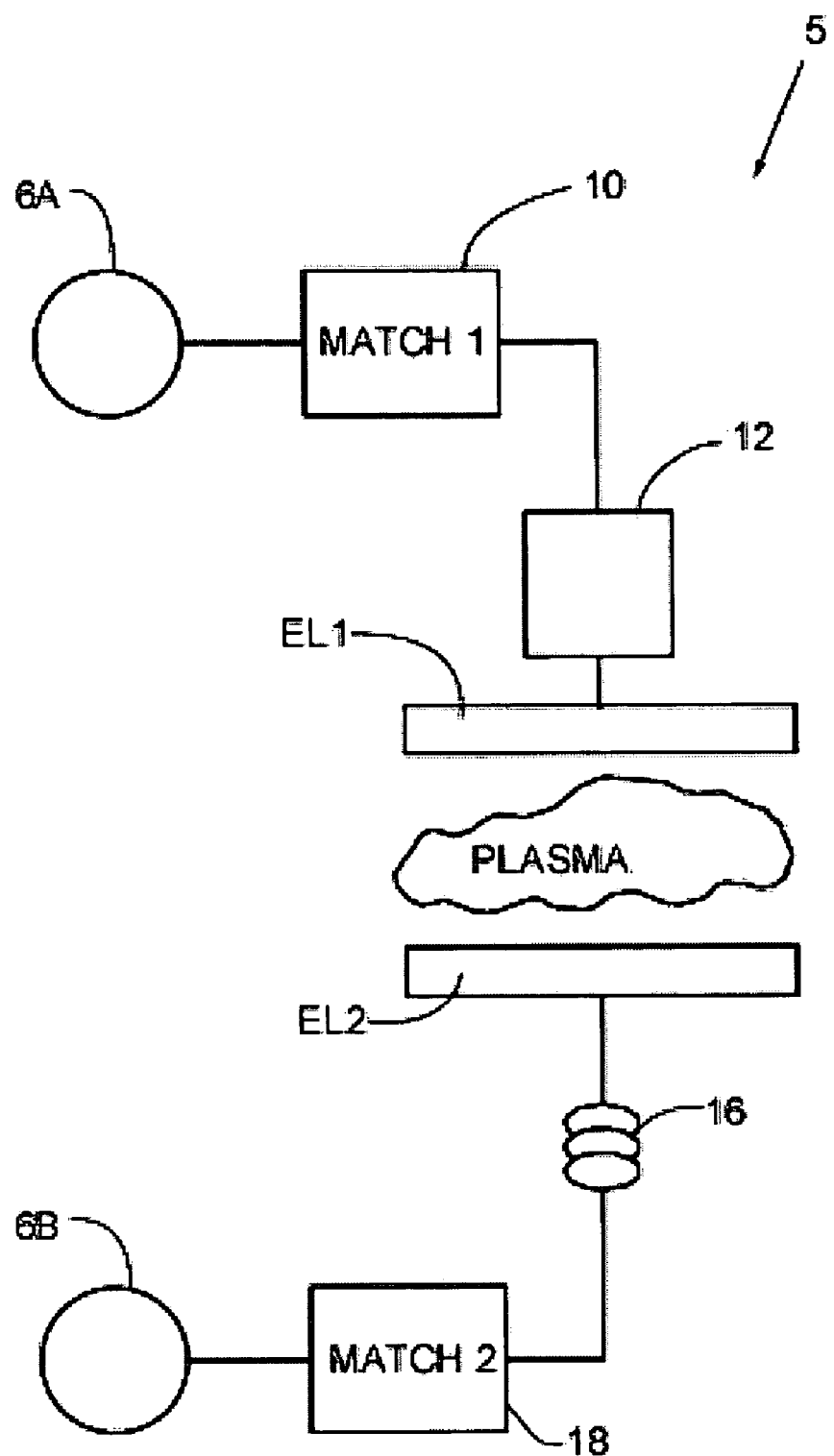
FIG. 1A is a high level block diagram of a plasma processing system that is to be characterized in accordance with an exemplary embodiment of the present invention.

Certain terminology used in the following description is for convenience only and is not limiting. The term "plasma reaction" as used herein refers to the process by which a substrate (e.g., a semiconductor wafer or a liquid crystal display panel) is processed in the presence of a plasma of either energized, neutral atoms or gaseous ions. The terms "plasma device", "plasma reactor" and "plasma chamber" as used herein refer to a device utilizing any form of self sustained collisional ionization, such as, for example, Magnetic Enhanced Reactive Ion Etching (MERIE) sources, Inductively Coupled Plasma (ICP) and Electron Cyclotron Resonance (ECR) sources. In the drawings, the same reference numerals are used for designating the same elements throughout the several figures.

Referring to FIG. 1A, a high level block diagram of a plasma processing system 5 in accordance with an exemplary embodiment of the invention is shown. The illustrated plasma processing system 5 is a capacitively coupled system using electrodes EL1 and EL2 (i.e., anode and cathode respectively) to generate a plasma therebetween under normal operating conditions. The system 5 further optionally includes first and second match networks 10 and 18, a sensor (e.g., a voltage, current or voltage/current sensor) and a choke inductor 16. Those skilled in the art will recognize that the match networks 10 and 18 are provided for matching the impedance of the processing system with the power applied by the RF power supply (not shown) which drives the system 5. Inductor 16 is provided to choke switching transients when the discharge voltage is discontinued when stopping the plasma reaction. Of course, alternative structures and methods are known to those in the art for sinking switching transients, the inductor illustrated being but a symbolic reference to this function.

In actual operation, the plasma processing system 5 generates, in the vicinity of the electrodes EL1 and EL2, a plasma for creating a plasma reaction. Such a plasma may be used in any number of processing steps including many semiconductor processing steps.

Figure 1B:
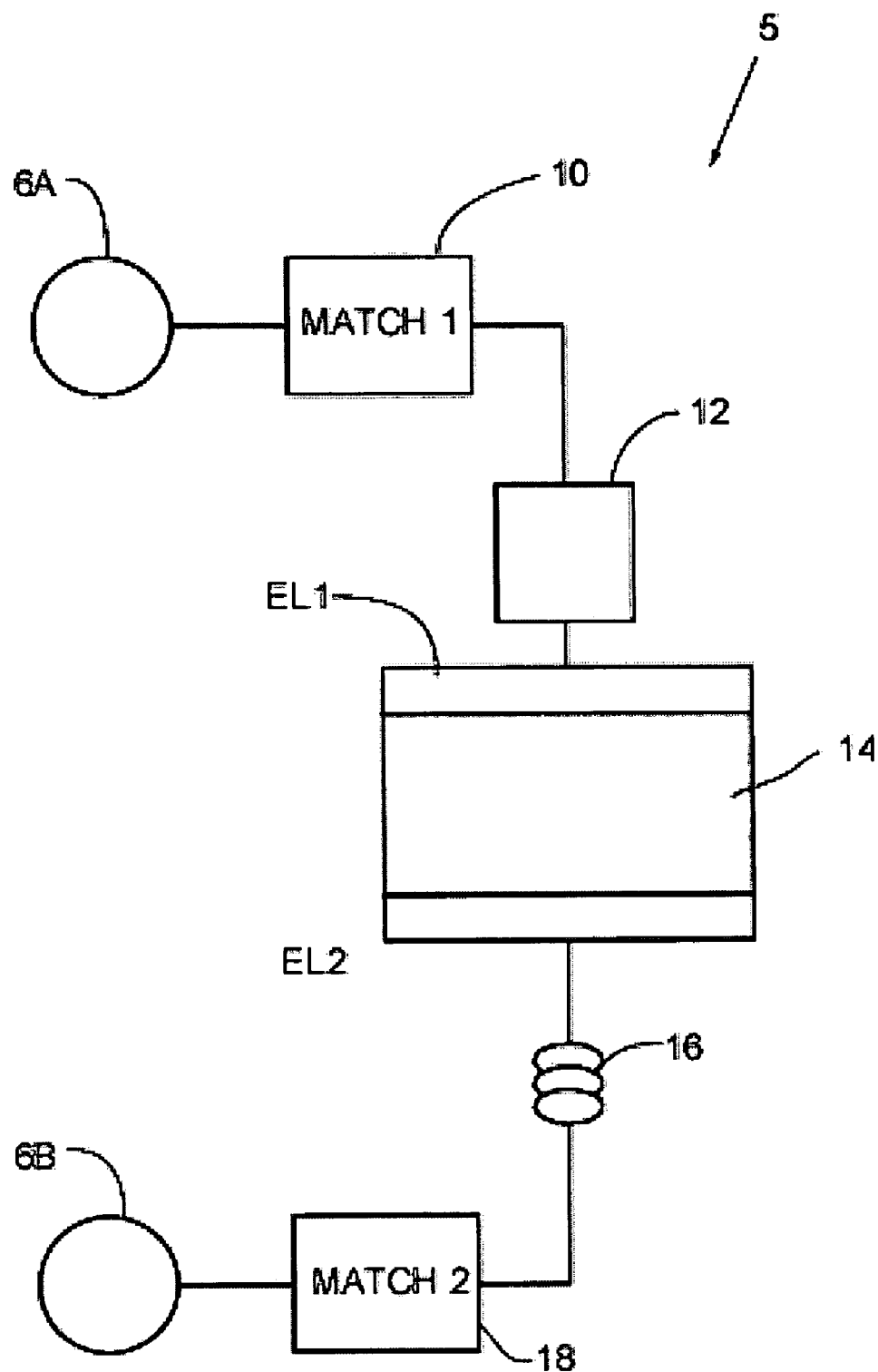
FIG. 1B is a high level block diagram of the plasma processing system of FIG. 1A where the plasma has been replaced by a non-linear test (or dummy) load in accordance with an exemplary embodiment of the present invention.

As shown in FIG. 1B, to alleviate the need for a plasma, a non-linear test load 14 may be substituted to model the plasma response so that tool and/or chamber testing data can be cost effectively provided for a plurality of frequency values via sensor 12. For example, sensor 12 can provide current and/or voltage data for a fundamental frequency and harmonics thereof. In the exemplary embodiment, it is assumed that the RF power is applied to the plasma processing system 5 using the terminals 6A and 6B. However, those skilled in the art will recognize that a different number of sources may also be utilized. For example, a single source can be used or multiple sources can be used in alternate embodiments.

Figure 2A:
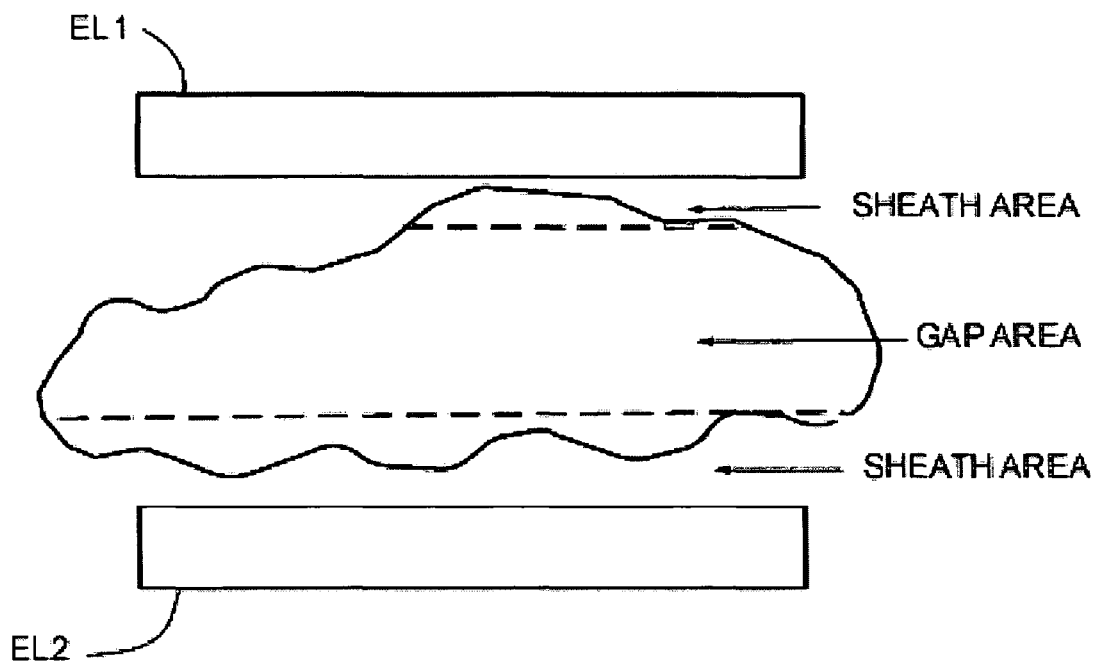
FIG. 2A is a schematic illustration of the major plasma areas within a plasma of a plasma processing system of FIG. 1A.

In order to properly model a plasma with an electrical circuit, the various electrical characteristics of the different areas must be identified. As shown in FIG. 2A, a plasma has a gap area that is bounded by two sheath areas, one sheath area in close proximity to each of the electrode plates (EL1 and EL2). The characteristics of each of those areas are discussed below.

Figure 2B:
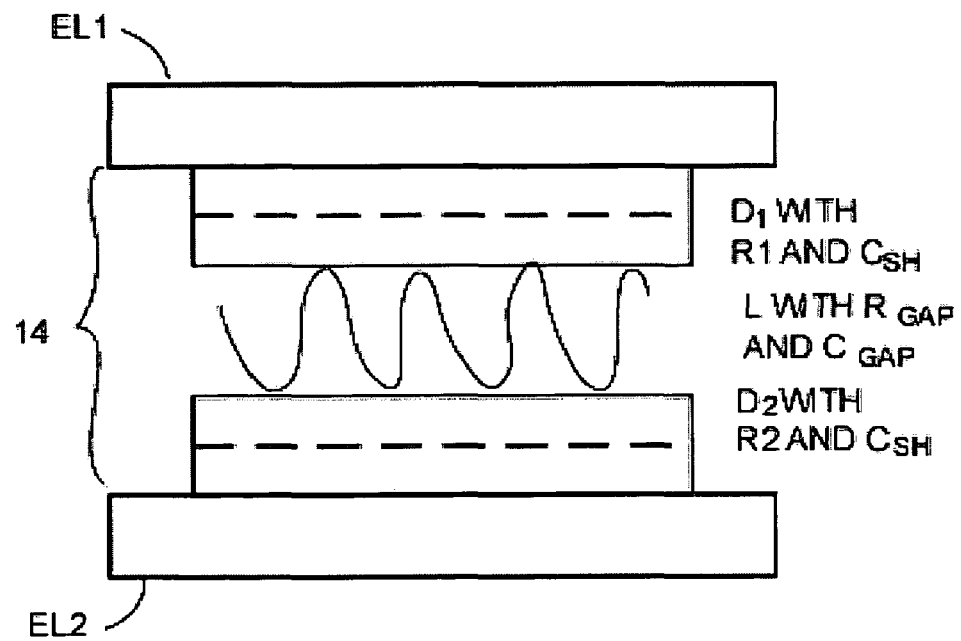
FIG. 2B is a block diagram of the non-linear test load of FIG. 1B used to simulate the corresponding major plasma areas of FIG. 2A.

Referring now to the block diagram of FIG. 2B, a more detailed description of non-linear test load 14 is provided. In the exemplary embodiment, the non-linear test load 14 models the plasma utilizing a silicon substrate having resistive, capacitive, and inductive elements and a diode array.

The non-linear test load 14 includes first and second semiconductor junctions (D1 and D2) for providing non-linear responses to the multi-frequency source of the plasma device. The first semiconductor junction exhibits first electrical characteristics for modeling a first plasma sheath (e.g., the anode sheath). The second semiconductor junction exhibits second electrical characteristics for modeling a second plasma sheath (e.g., the cathode sheath). Between the two junctions is provided an element or circuit (as described more fully below) that exhibits electrical characteristics of the gap area. Thus, when the non-linear dummy load is positioned between the anode and cathode of the multi-frequency plasma device (absent the plasma), tool and/or chamber testing data can be provided as if a plasma reaction were present.

The exemplary non-linear test load 14 is dimensioned on the order of a few centimeters in thickness, and may employ a spring-loaded inductor L such that it may be readily biased between opposing electrodes EL1 and EL2. In one embodiment, the spring loaded inductor L includes a helically wound copper coil (e.g., wire or strap material may be used). Alternative metals exist which may have more desirable electrical properties in accordance with a specific application or frequency spectrum. Further, the resistance value R of the exemplary non-linear test load 14 is provided by the material, namely silicon in this case, having a resistivity of about 100 $\Omega$-cm. Thus, the non-linear test load 14 of the exemplary embodiment is adapted in construction in accordance with the operating power, with power level comparable to typical power levels for the individual plasma system 5. Additionally, the exemplary non-linear test load 14 may be adapted to operate at atmospheric pressure, above atmospheric pressure, or below atmospheric pressure.

As shown, the exemplary non-linear test load 14 may be a substrate having an upper and lower member joined by an inductor L such that a capacitance Cgap is exhibited between the corresponding halves. Of course, those skilled in the art recognize that the present invention is not limited to such an arrangement and that an integral substrate may be provided exemplifying the electrical properties of the plasma described herein.

In an alternative embodiment, the non-linear test load 14 may include channels therein (not shown) for receiving a cooling fluid to keep the temperature of the load at a constant temperature. In such an embodiment, measurements of the coolant flow rate and temperature could also be used to estimated power dissipation to the load. Also, the non-linear load can comprise one or more temperature compensating elements, such as capacitors having positive and/or negative temperature coefficients. Further, the non-linear test load 14 may include a memory and processing mechanism for storing test data internal to the test load (not shown). In addition, the non-linear load can also comprise a sensor, such as a temperature sensor.

Figure 3:
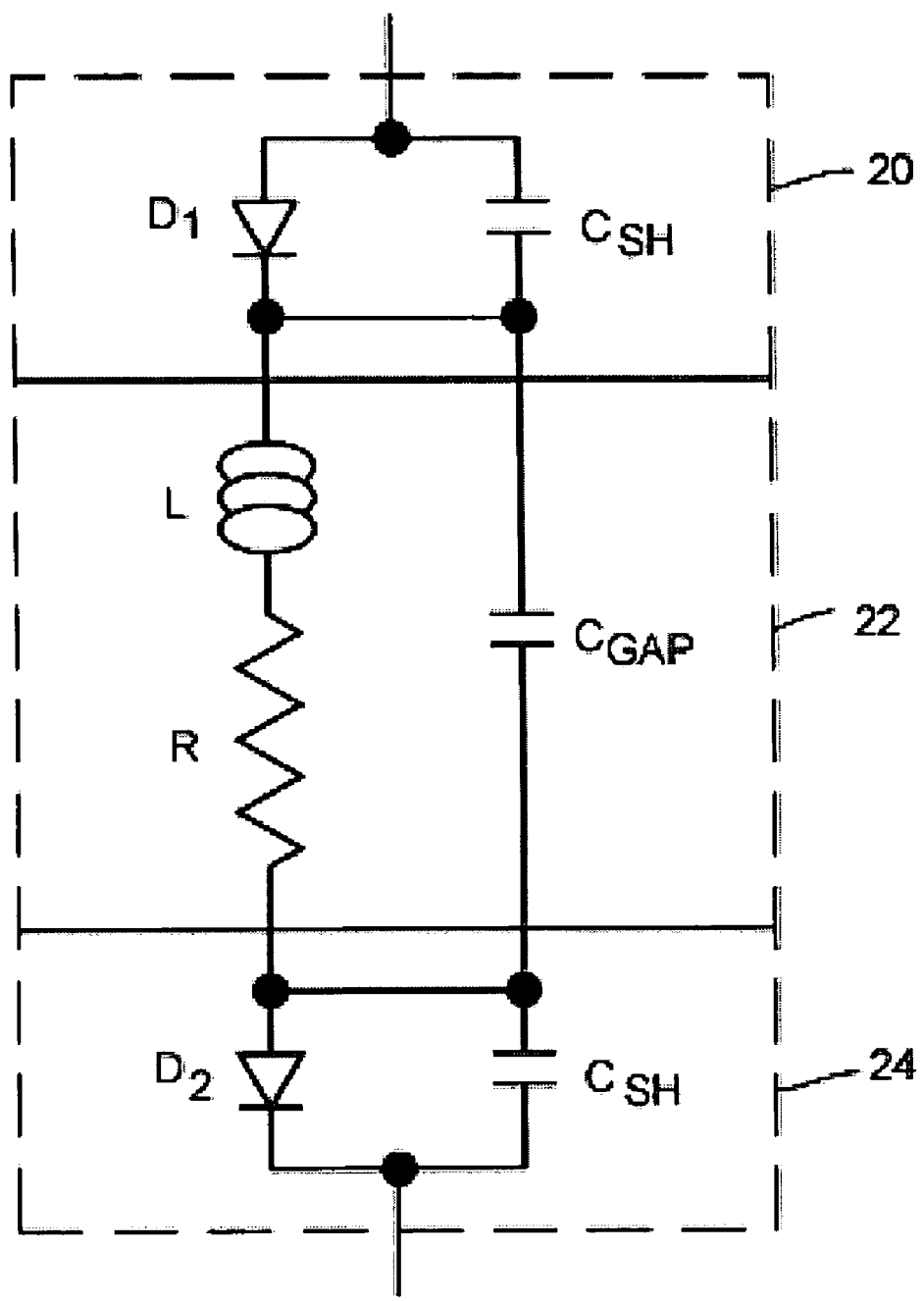
FIG. 3 is a circuit schematic of a circuit equivalent to the non-linear test load of FIG. 1B.

Referring now more specifically to FIG. 3, a schematic diagram is shown to explain the electrical functionality of the components of FIG. 2 outlined above. The first semiconductor junction is shown by the dashed box 20, the plasma component by dashed box 22, and the second semiconductor junction by dashed box 24.

In the first semiconductor junction 20, the junction is provided by a diode D1 connected in parallel to a capacitor. The plasma sheath, like a diode, reacts non-uniformly in response to an input signal comprising one or more frequencies. The capacitor Csh is selected to model the plasma sheath capacitance in the vicinity of the electrode EL1. The second semiconductor junction 24 is selected to model the plasma sheath capacitance in the vicinity of the electrode EL2.

Generally, plasma sheath capacitance is estimated as:

$$C_s = \epsilon_o A/d_s$$

where A is the surface area of the electrode EL1, $\epsilon_o$ is the permeativity of free space $\epsilon_o = 8.8542 \times 10^{-12}$ F/m, and $d_s$ is the thickness of the plasma sheath. For a DC plasma sheath, $ds = 10\lambda_D$ and $\lambda_D = (\epsilon_o T_e/en)^{1/2}$ is the Debye length, here $T_e$ is the electron temperature and e is the electronic charge.

For an RF electrode, the sheath thickness is given by $$s = 2/3(2Vo/Te)3/4$$

where $V_o$ is the voltage across the sheath. Thus, the sheath capacitance is in the range of 20–200 pF for typical capacitive RF plasma.

The gap area is simulated by an additional component (or set of components) 22. The component 22 includes at least one of an inductor L, a resistor R, and a capacitor Cgap. For example, the resistor R, the capacitor Cgap, and the inductor L can be selected to model the plasma resistance, capacitance and inductance, respectively.

The plasma resistance R measured between the electrodes (or in operation between an upper electrode and a wafer holding chuck) is usually quite small, i.e. from a fraction of one ohm to a few ohms. For a plasma between the electrode and the ground plate, the plasma resistance is given by:

$$R = \gamma/\omega_p^2 C_o \propto \gamma/n$$

where $\gamma$ is the electron neutral collision frequency, $\omega_p$ is the plasma frequency, $C_0$ is the capacitance between the electrodes and n is the electron density. For the non-linear test load 14, the preferable resistance is chosen to be comparable to the typical plasma resistance of the individual process system and, as mentioned above may be silicon which is integrated with a substrate of the non-linear test load 14. For example, different resistance values can be used to model different plasmas, and the different resistance values can be provided using at least one of a fixed resistor, a thermistor, and a variable resistor.

An inductive element L is provided for modeling the plasma inductance which is given by $$L = 1/\omega_p^2 C_o \propto 1/n$$

Note that the plasma inductance is related to the plasma resistance by $R = \gamma L$. For example, different inductance values can be used to model different plasmas, and the different inductance values can be provided using at least one of a fixed inductor, a temperature compensating inductor, and a variable inductor. The capacitance Cgap models the capacitance between the electrodes EL1 and EL2. As shown in FIG. 2, a gap may be created by a spring type inductor L which provides a physical separation between adjoining members of the substrate of the non-linear test load 14. For example, different capacitance values can be used to model different plasmas, and the different capacitance values can be provided using at least one of a fixed capacitor, a temperature compensating capacitor, and a variable capacitor. To avoid opening the chamber, the dummy load may be fitted with an optical or radio receiver which controls the resistance, capacitance and/or inductance of the dummy load according to instructions from a remote controller.

Figure 4:
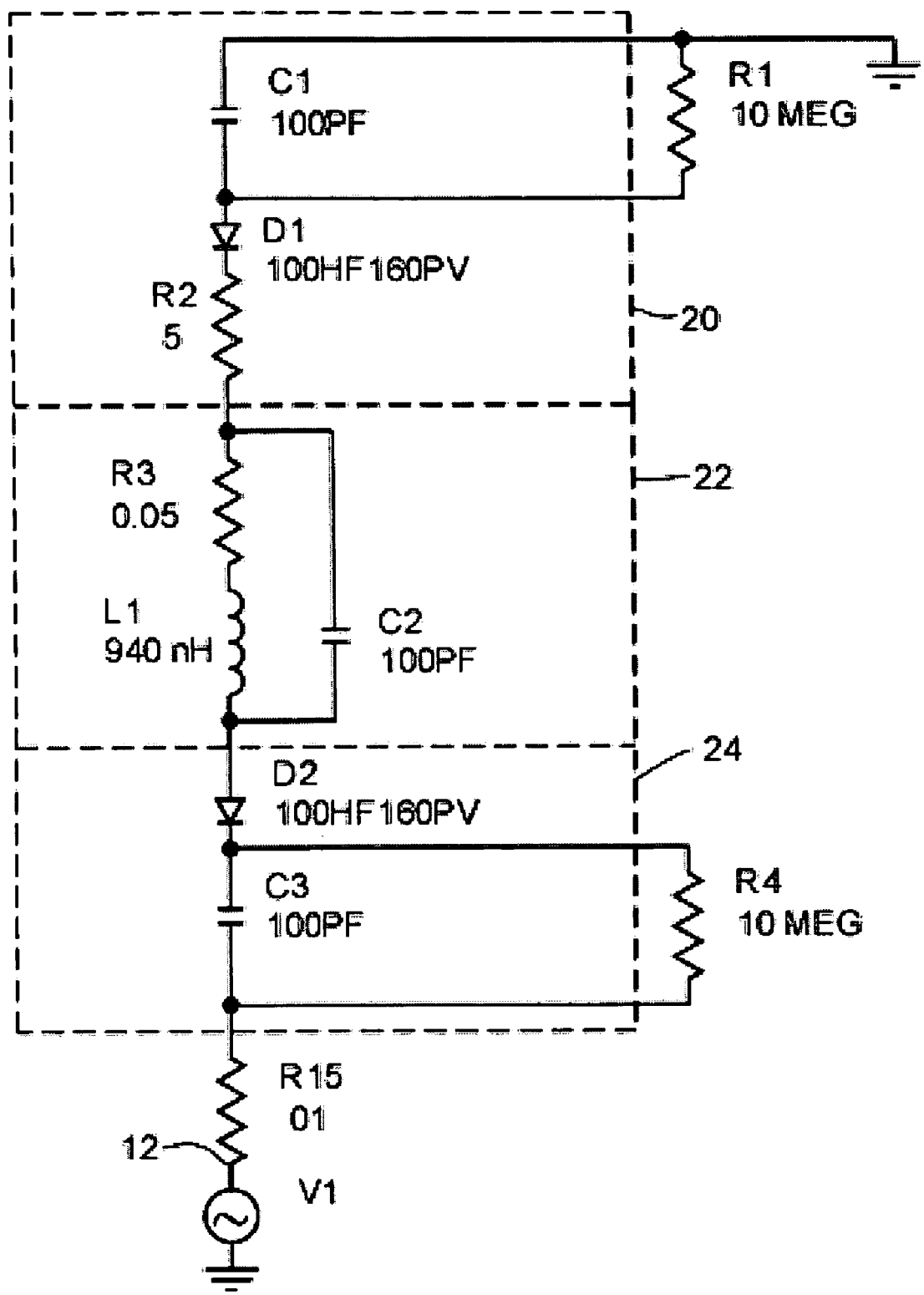
FIG. 4 is an exemplary circuit schematic having DC stability resistors and sample component specifications for obtaining multi-frequency readings from the circuit of FIG. 3.

FIG. 4 is a schematic diagram including resistors R1 and R4 which are provided for DC stability purposes. C1 models the capacitance Csh of the sheath area near electrode EL1. Resistors R2 and R3 represent the values of the plasma resistance, in the exemplary embodiment, this is the upper and lower portions of the non-linear test load 14 separated by Cgap which corresponds to C2. R3 represents the resistance of the inductor L1. R15 is a sense resistor provided for use with a sensor 12. Of course, diodes D1 and D2 provide the non-linear response. Those skilled in the art will recognize that diodes are but a single form of a non-linear semiconductor junction and that the present invention is not limited to semiconductor diode junctions only, their symbolic description is but a tool for explaining the non-linear response of test load 14.

Figure 5:
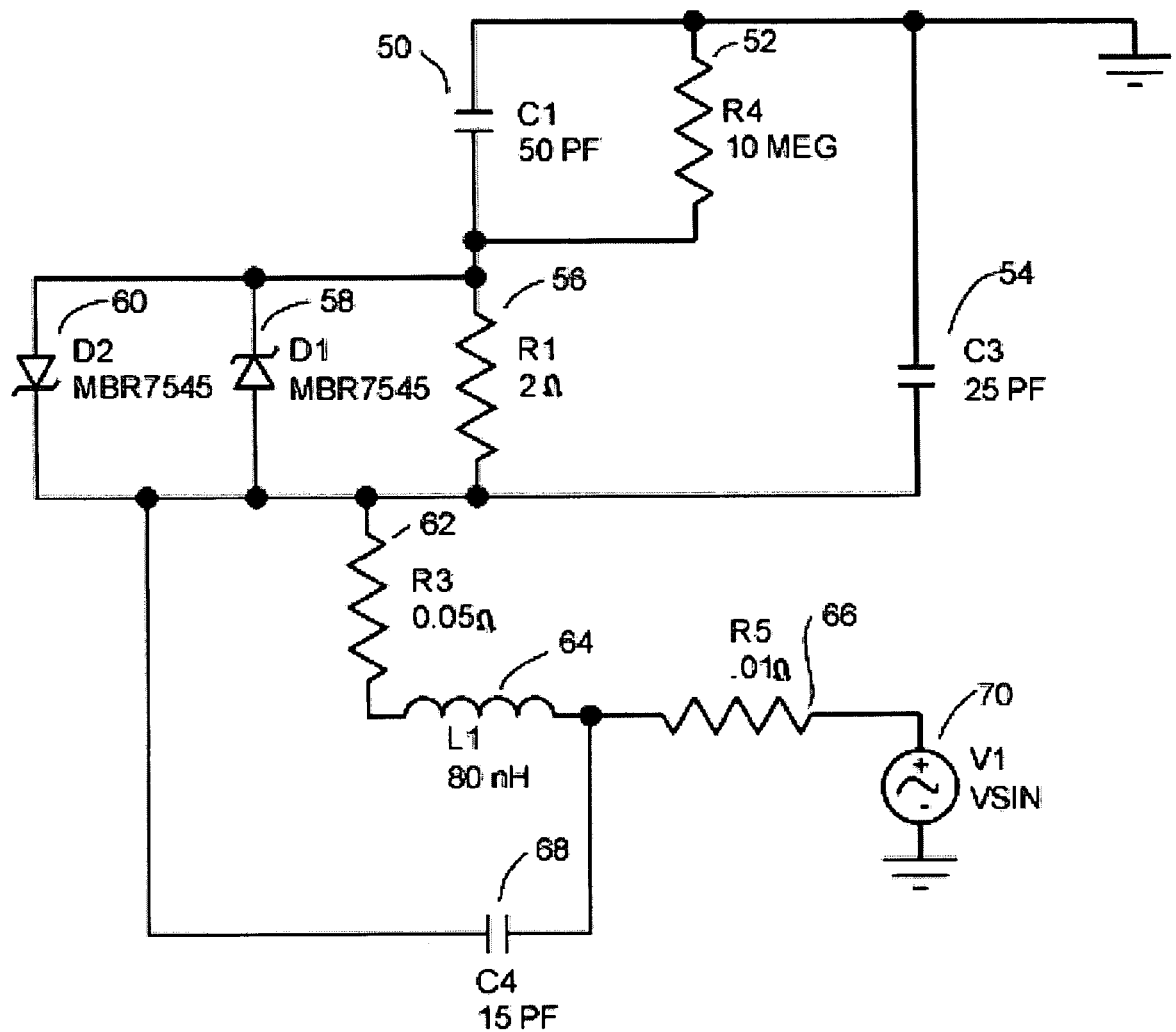
FIG. 5 is an exemplary embodiment of a circuit representing the dummy load of FIGS. 6 and 7.

Implementing such a design at normal operating frequencies (13.56 MHz and above) with hardware that fits into the process gap (approx 40 mm) is demanding. For example, compromises in the operating frequency could produce a system resonance at a harmonic, and changing the process gap to accommodate larger hardware could change system resonances. FIG. 5 is a schematic of one implementation of a circuit according to the present invention that operates at higher frequencies, fits in the process gap, and provides the desired non-linear response.

Figure 6:
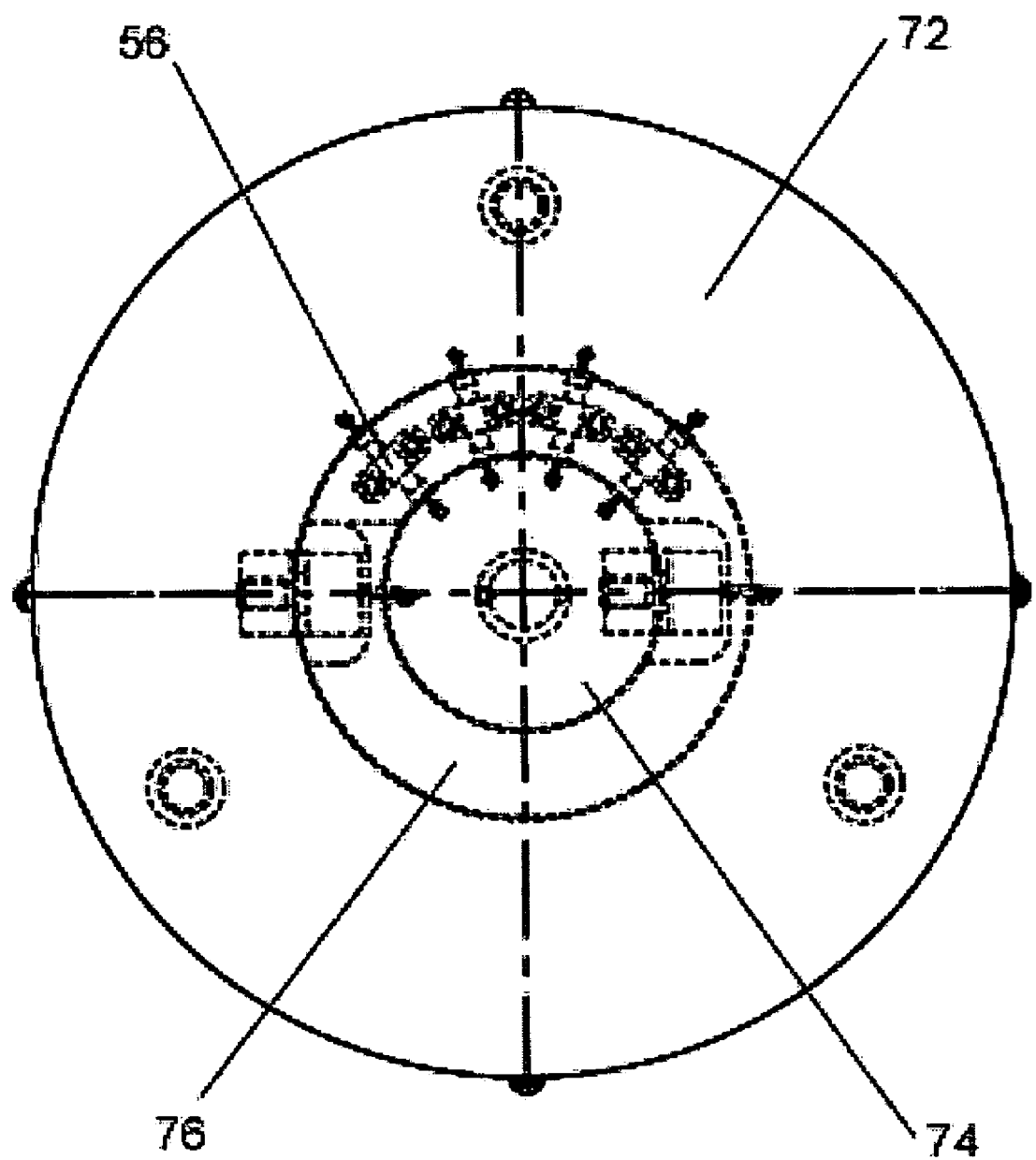
FIG. 6 is a plan view of a dummy load according to one embodiment of the present invention.

The non-linear element of the device is constructed by two high-power, high-frequency diodes, 58 and 60, (e.g., part numbers MBR7545) arranged in opposing directions. The diodes also serve to limit the voltage across a first resistor R1 (56) (e.g., 2 ohms), negating the need for large, externally cooled power resistors. The circuit can be embodied (or housed) within a ring as shown in FIG. 6. In such an embodiment, the outer ring 72 (including plates 80) acts as a capacitor 50 (in FIG. 5) (e.g., 200 pF). The outer ring 72 of FIG. 6 also servers as heat sink for the diodes 58 and 60.

Figure 7:
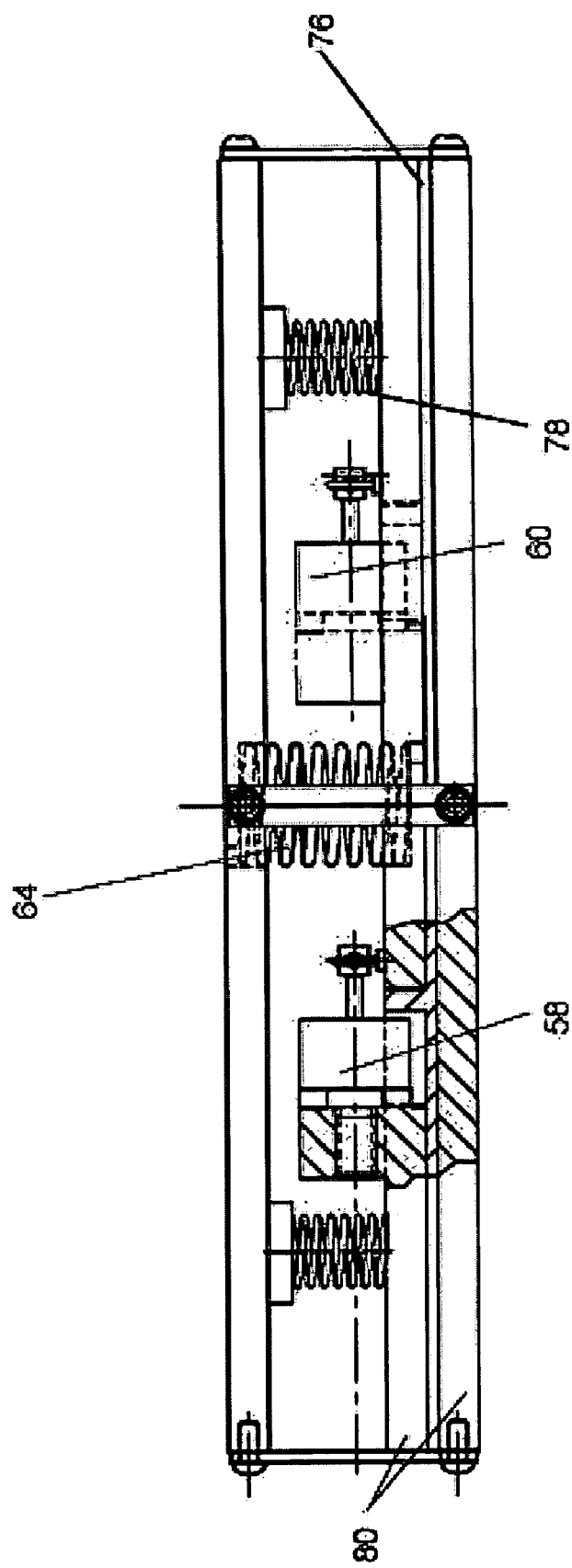
FIG. 7 is a side cross-sectional view of a dummy load according to FIG. 6.

The inner ring 74 (FIG. 6) similarly acts as a second capacitor 54 (FIG. 6) (25 pF). The area ratio of the outer ring 72 to the inner ring 74 is chosen to be at least 10:1 to limit bypassing the diodes 58 and 60 and load resistor 56. The resistances of resistor 56 and the resistance (illustrated as a resistor 62 (0.05 ohm)) due to the windings of the inductor 64 (FIG. 7), along with the VI drop of the diodes 58 and 60, comprises the real impedance part of the dummy load.

The inductive portion of the dummy load is represented as the inductor 64 (e.g., 80 mH). Stray capacitance is modeled as a capacitor 68 (e.g., 15 pF). Such a capacitance corresponds to the capacitance between L1 and its surrounds, could be a winding capacitance if L1 has windings. L1 could simply be a strap of copper a few inches long at these inductance values. Similarly, a current 'sense' resistor 66 is modeled for simulation purposes as well. The dummy load further comprises a tensioning spring 78. The dielectric blocks insulate the springs from the surrounding structure. The dielectric 76 separates the plates of the main capacitor 80. The dielectric is chosen for performance considerations: dielectric constant, breakdown voltage and loss tangent and may be formed, for example, from Teflon or alumina.

The duty cycle should be limited to prevent overheating of components. For example, a 25% duty cycle may be used (e.g., 30 seconds on, 90 seconds off), but other duty cycles may be practiced within the spirit of this invention.

Figure 8:
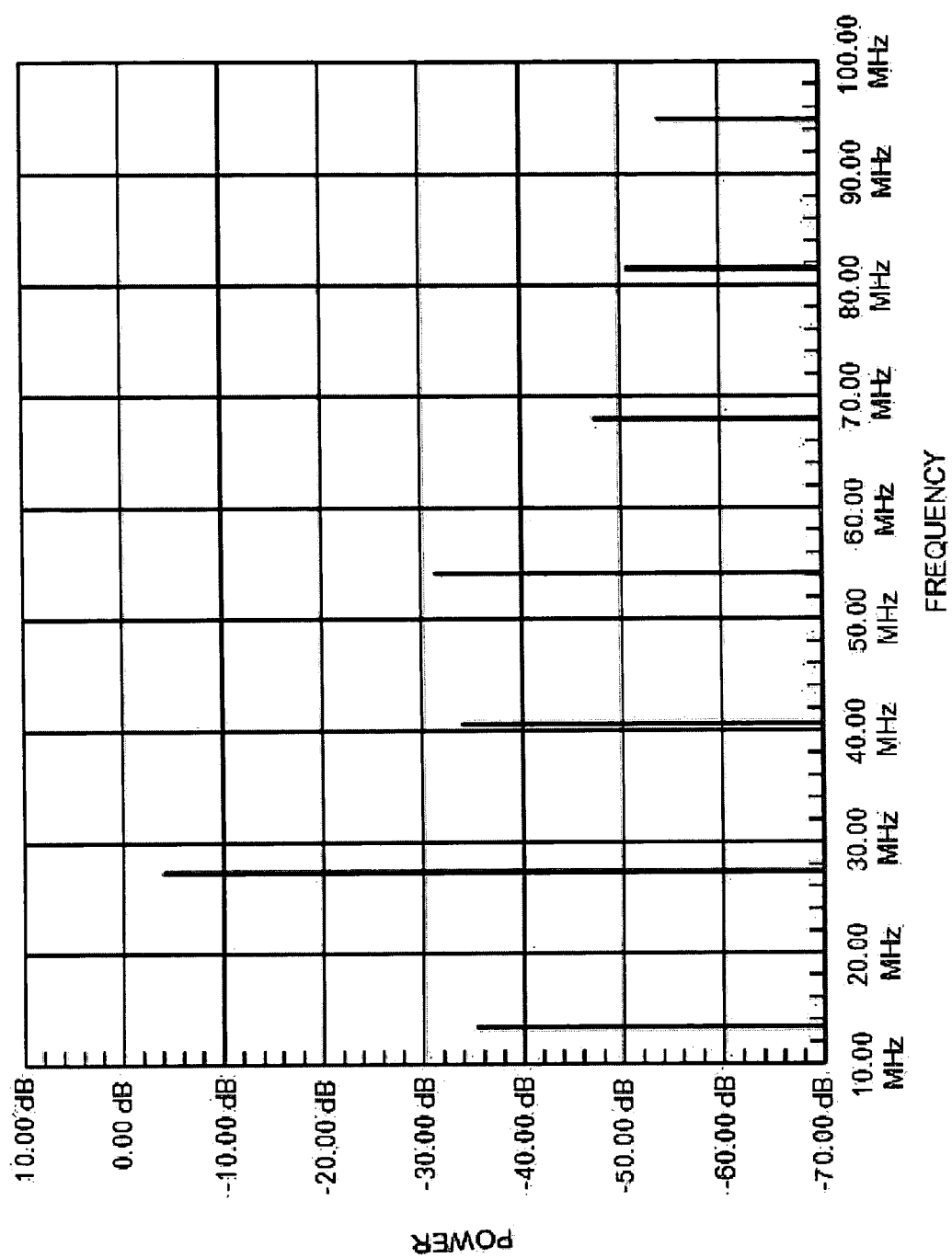
FIG. 8 is a graph of a spectral response using the dummy load according to FIGS. 6 and 7.

A resulting spectral response from using the circuit of FIG. 5 is illustrated in FIG. 8.

Figure 9:
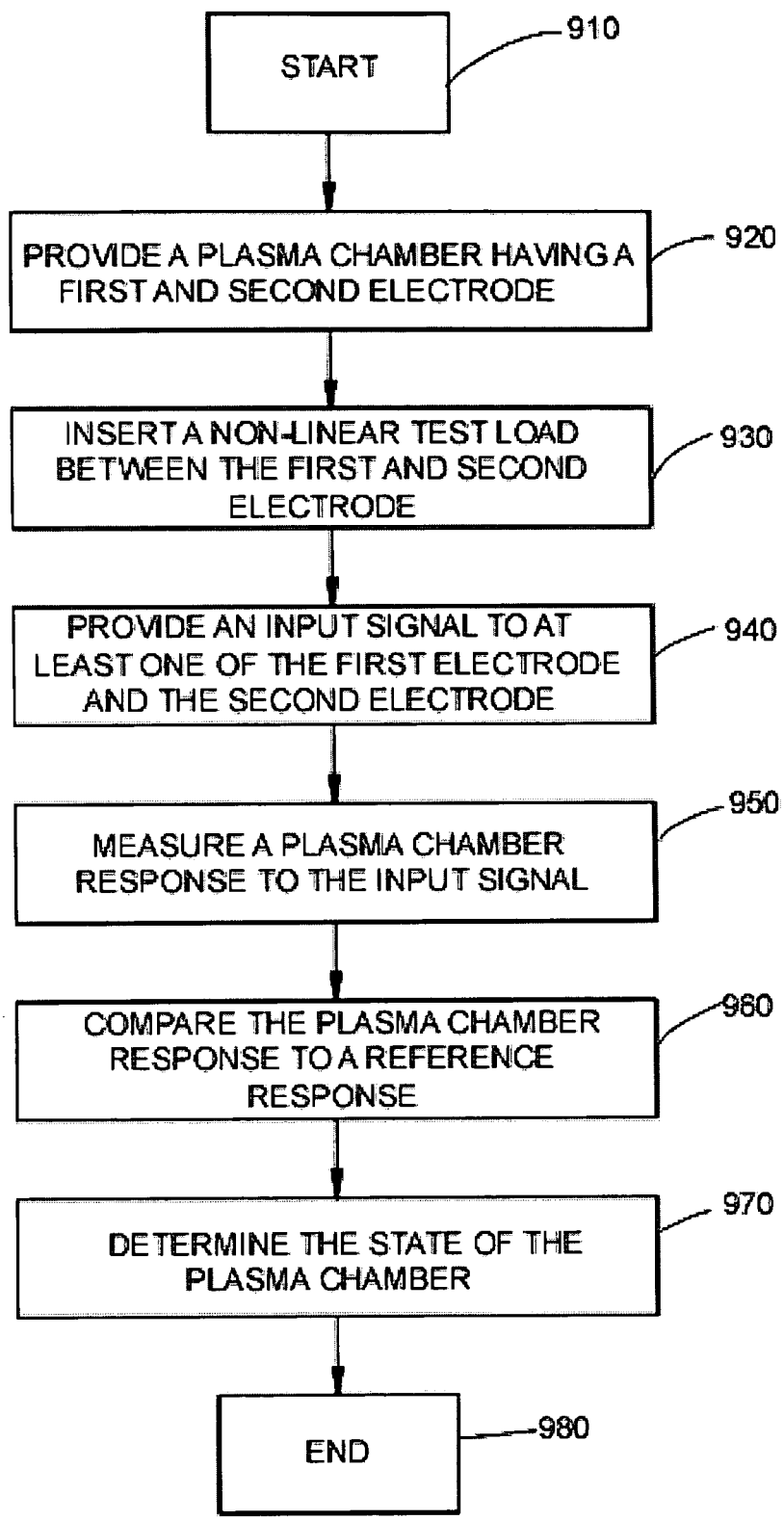
FIG. 9 illustrates a flow diagram of a method for determining the state of a plasma device

FIG. 9 illustrates a flow diagram of a method for determining the state of a plasma device. Procedure 900 starts in 910. In 920, a plasma chamber can be provided that has a first and second electrode. In 930, a non-linear test load can be inserted between the first electrode and the second electrode, and the non-linear test load can be constructed to model at least one plasma reaction. In 940, an input signal can be provided to at least one of the first electrode and the second electrode using a at least one frequency source. For example, a first signal can be provided to the first electrode and/or a second signal can be provided to the second electrode. In 950, a plasma chamber response to the input signal can be measured using a sensor that can be coupled to at least one of the first electrode and the second electrode. In 960, the plasma chamber response can be compared to a reference response. In 970, the state of the plasma chamber is determined, and procedure 900 ends in 980. For example, a determination can be made that the plasma chamber is correctly assembled when the plasma chamber response substantially equals the reference response. Also, a determination can be made that the plasma chamber is properly conditioned (e.g., after a cleaning) when the plasma chamber response substantially equals the reference response.

Obviously, readily discernible modifications and variations of the present invention are possible in light of the above teachings. It is therefore to be understood that within the scope of the appended claims, the invention may be practiced otherwise than as specifically described herein. For example, while described in terms of discrete components, it is contemplated that the individual functionality of each component may be performed by a single programmable device such as any one of a programmable logic array (PLA), a programmable logic gate (PLG), a system on a chip (SOC), an Application Specific Integrated Circuit (ASIC) and the like, as long as it can properly handle the applied power.

Thus, the foregoing discussion discloses and describes merely an exemplary embodiment of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A non-linear test load for insertion between anode and cathode plates of a plasma device and for modeling the response of the device to a plasma, comprising:
    a first circuit for exhibiting electrical characteristics of a first sheath area near the anode;
    a second circuit for exhibiting electrical characteristics of a second sheath area near the cathode;
    a third circuit for exhibiting electrical characteristics of a gap area between the first and second sheath areas; and
    wherein it can be decided that the plasma device is correctly assembled based on the electrical characteristics of the third circuit.

2. The non-linear test load as claimed in claim 1, wherein the first circuit comprises a first semiconductor junction for providing the first non-linear response.

3. The non-linear test load as claimed in claim 1, wherein the second circuit comprises a second semiconductor junction for providing the second non-linear response.

4. The non-linear test load as claimed in claim 1, wherein the third circuit comprises a capacitor and an inductor in parallel.

5. The non-linear test load as claimed in claim 1, wherein the first and second circuits are provided on a semiconductor substrate.

6. A non-linear test load for insertion between anode and cathode plates of a multi-frequency plasma device and for modeling the response of the device to a plasma, comprising:
    first and second plates exhibiting eletrical characteristics of sheath areas of of a plasma respectively;
    at least one spring coupled to and seprating the first and second plates;
    a circuit, housed between the first and second plates, and exhibiting characterics of a gap area of a plasma; and
    wherein it can be decided that the plasma device is correctly assembled based on the electrical characteristics of the circuit.

7. The non-linear test load as claimed in claim 6, further comprising a dielectric block for separating the first plate from and coupling the first plate to the at least one spring.

8. The non-linear test load as claimed in claim 6, wherein the circuit comprises two diodes arranged in opposing directions.

9. The non-linear test load as claimed in claim 6, wherein the circuit comprises an inductive winding.

10. A method for qualifying a plasma chamber, the method comprising:
    providing a plasma chamber having a first and second electrode;
    inserting a non-linear test load between the first electrode and the second electrode, wherein the non-linear test load is constructed to model at least one plasma reaction;
    providing a first signal to at least one of the first electrode and the second electrode using a at least one frequency source;
    measuring a plasma chamber response to the first signal, wherein a sensor is coupled to at least one of the first electrode and the second electrode;
    comparing the plasma chamber response to a reference response; and
    deciding that the plasma chamber is correctly assembled when the plasma chamber response substantially equals the reference response.

11. The method for qualifying a plasma chamber as claimed in claim 10, the method comprising:
    providing a second signal to at least one of the first electrode and the second electrode;
    measuring a second plasma chamber response to the second signal;
    comparing the second plasma chamber response to a second reference response; and
    deciding that the plasma chamber is correctly assembled when the second plasma chamber response substantially equals the second reference response.

12. A method for qualifying a plasma chamber, the method comprising:
    providing a plasma chamber having a first and second electrode;

inserting a non-linear test load between the first electrode and the second electrode, wherein the non-linear test load is constructed to model at least one plasma reaction;

providing a first signal to at least one of the first electrode and the second electrode using a at least one frequency source;

measuring a plasma chamber response to the first signal, wherein a sensor is coupled to at least one of the first electrode and the second electrode;

comparing the plasma chamber response to a reference response; and deciding that the plasma chamber is properly conditioned when the plasma chamber response substantially equals the reference response.

13. The method for qualifying a plasma chamber as claimed in claim 12, the method comprising:

providing a second signal to at least one of the first electrode and the second electrode;

measuring a second plasma chamber response to the second signal;

comparing the second plasma chamber response to a second reference response; and deciding that the plasma chamber is properly conditioned when the second plasma chamber response substantially equals the second reference response.

* * * * *